United States Patent
Chen et al.

(10) Patent No.: US 8,634,198 B2
(45) Date of Patent: Jan. 21, 2014

(54) CONNECTION DEVICE OF CABLE MANAGEMENT ARM

(75) Inventors: Ken-Ching Chen, Kaohsiung (TW);
Shun-Ho Yang, Kaohsiung (TW);
Cheng-Hui Yang, Kaohsiung (TW);
Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 310 days.

(21) Appl. No.: 13/174,868

(22) Filed: Jul. 1, 2011

(65) Prior Publication Data
US 2013/0000940 A1    Jan. 3, 2013

(51) Int. Cl.
*H05K 7/00* (2006.01)
*H05K 7/16* (2006.01)
*H05K 1/14* (2006.01)
*H05K 5/00* (2006.01)
*H02G 3/04* (2006.01)
*F16L 3/08* (2006.01)

(52) U.S. Cl.
USPC ............ 361/747; 174/68.3; 248/70; 361/727; 361/740; 361/756

(58) Field of Classification Search
USPC ............ 174/68.3; 248/70; 361/727, 747, 756, 361/825–826, 740
See application file for complete search history.

(56) References Cited

U.S. PATENT DOCUMENTS

| 7,023,708 | B2 | 4/2006 | Nguyen et al. | |
|---|---|---|---|---|
| 7,473,846 | B2 | 1/2009 | Doerr et al. | |
| 7,746,667 | B1 | 6/2010 | Baiza et al. | |
| 2004/0079711 | A1* | 4/2004 | Hartman et al. | 211/26 |
| 2006/0113433 | A1* | 6/2006 | Chen et al. | 248/70 |
| 2008/0122333 | A1* | 5/2008 | Tseng et al. | 312/333 |
| 2009/0014601 | A1 | 1/2009 | Chen et al. | |
| 2009/0065658 | A1 | 3/2009 | Chen et al. | |
| 2010/0171015 | A1* | 7/2010 | Chen et al. | 248/224.8 |

* cited by examiner

*Primary Examiner* — Jeremy Norris
*Assistant Examiner* — Sherman Ng
(74) *Attorney, Agent, or Firm* — Rosenberg, Klein & Lee

(57) ABSTRACT

A connection device of a cable management arm includes a fixing frame having a protrusion portion, a connection member having a contact portion, and a locking member pivotably connected to the connection member. The locking member includes a locking portion and a resilient portion which contacts the contact portion of the connection member. When the connection member is pivotally connected to the cable management arm, the fixing frame is fixed to a rail. When the connection member is connected to the fixing frame, the resilient portion provides a force to lock the locking portion to the protrusion portion of the fixing frame so as to securely connect the connection member to the fixing frame.

16 Claims, 6 Drawing Sheets

CONNECTION DEVICE OF CABLE MANAGEMENT ARM

FIELD OF THE INVENTION

The present invention relates to a connection device for a cable management arm, and more particularly, to a connection device which allows the cable management arm to be quickly connected to or removed from rack, chassis or slide assembly.

BACKGROUND OF THE INVENTION

U.S. Pat. No. 7,473,846 to Doerr discloses a reversible cable support arm. As shown in FIG. 7, a cable support arm 24 is connected to rails 108. The cable support arm has a mounting bracket 92 connected to an end thereof and the lower portion 100 of the mounting bracket 92 has multiple keyhole slots 94 and a plunger 98. The inner slide member 112 of the rails comprises one or multiple boss members 116 and an aperture. The mounting bracket 92 on one end of the cable support arm 24 is fixed to the inner slide member 112 by inserting the boss members 116 into the keyhole slots 94 and by the plunger 98 inserted into the aperture of the inner slide member 112.

On the other hand, an attachment mechanism 52 is connected to the other end of the cable support arm 24 and connected to the outer slide member 110 of the rails 108. The outer slide member 110 comprises a plunger 132. The attachment mechanism 52 comprises a securing portion 120 which has an aperture 134 with which the plunger 132 of the outer slide member 110 is engaged, such that the cable support arm 24 is connected to the outer slide member 110.

The rails are installed to a rack housing 22 of the rack mount system 10 and a device 12, 14, 16, 18 or 20 can be installed to the rails. However, the connection between the rails and the cable support arm 24 is mainly relied to the insertion of the plungers 98 and 132 into the holes of the corresponding object, and the plungers 98 and 132 protrude out from the device and which occupy the room in the housing. The connection between the rails and the cable support arm has to be improved so as to maintain the room or even to enlarge the room.

SUMMARY OF THE INVENTION

The present invention relates to a connection device of a cable management arm and comprises a fixing frame having a protrusion portion. A connection member is pivotably connected to the cable management arm and has a contact portion. A locking member is pivotably connected to the connection member and has a locking portion and a resilient portion wherein the resilient portion contacts the contact portion of the connection member. When the connection member is connected to the fixing frame, the resilient portion provides a force to lock the locking portion to the protrusion portion of the fixing frame.

Preferably, the fixing frame has a pair of bent portions which define a passage so that the connection member is inserted and installed in the passage of the fixing frame.

Preferably, the connection member has a pair of stops which are located corresponding to the bent portions of the fixing frame. When the connection member is inserted into the passage of the fixing frame, the stops contact the bent portions.

Preferably, the connection member has an operation window and the locking member has a driving portion which is located corresponding to the operation window.

Preferably, a cap is connected to the driving portion of the locking member and has a portion thereof exposed via the operation window.

Preferably, the connection member has an engaging window and the locking portion of the locking member is located in the engaging window.

Preferably, the contact portion of the connection member is a window through which the resilient portion extends and contacts an inside of the window.

The present invention further provides a cable management system which comprises a cable management arm having a first end and a second end. A first fixing frame is fixed to a first rail and has a protrusion portion. A first connection member is pivotably connected to the first end of the cable management arm and has a contact portion. A first locking member is pivotably connected to the first connection member and has a locking portion and a resilient portion, wherein the resilient portion of the first locking member contacts the contact portion of the first connection member. A second rail is slidable relative to the first rail. A second fixing frame is fixed to the second rail and has a protrusion portion. A second connection member is pivotably connected to the second end of the cable management arm and has a contact portion. A second locking member is pivotably connected to the second connection member and has a locking portion and a resilient portion. The resilient portion of the second locking member contacts the contact portion of the second connection member. When the first connection member is connected to the first fixing frame, the resilient portion of the first locking member provides a force to lock the locking portion of the first locking member to the protrusion portion of the first fixing frame. The first end of the cable management arm is connected to the first rail by the first connection member. When the second connection member is connected to the second fixing frame, the resilient portion of the second locking member provides a force to lock the locking portion of the second locking member to the protrusion portion of the second fixing frame. The second end of the cable management arm is connected to the second rail by the second connection member.

Preferably, each of the connection members has an operation window and each of the locking members has a driving portion which is located corresponding to the operation window of the each connection member.

Preferably, the first fixing frame has a pair of first bent portions which define a passage and are fixed to the first rail. The second fixing frame has a pair of second bent portions which define a passage. The first connection member and the second connection member are respectively inserted into the passage of the first fixing frame and the passage of the second fixing frame to be installed.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
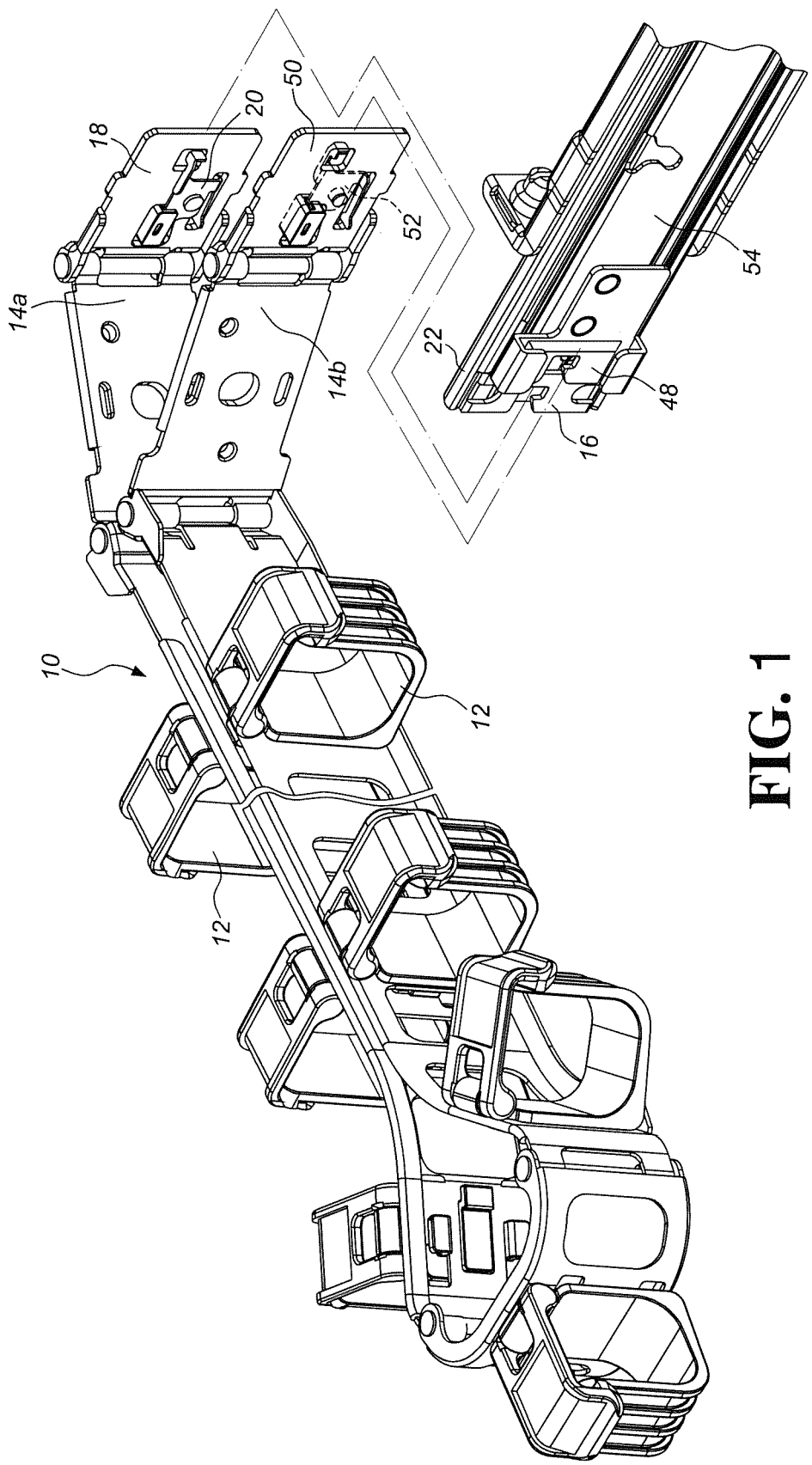
FIG. 1 shows that the cable management arm of the present invention is to be connected to the rail.
Figure 2:
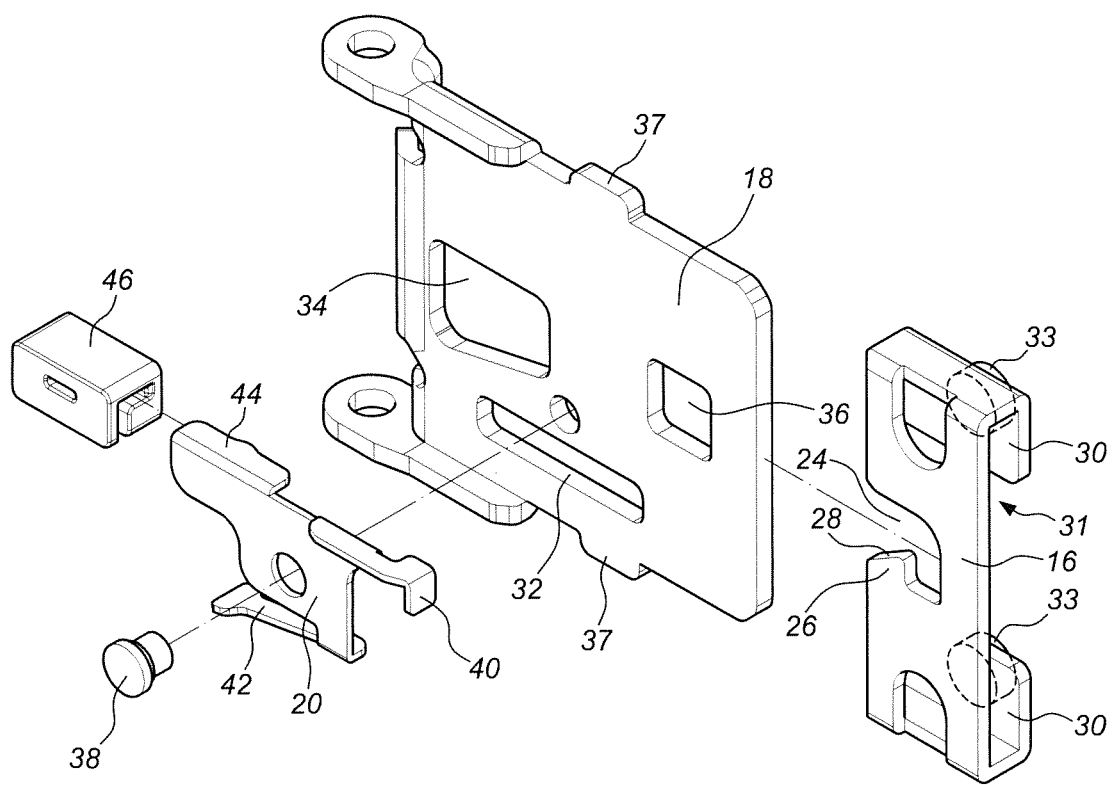
FIG. 2 is an exploded view to show the connection device of the present invention.
Figure 3:
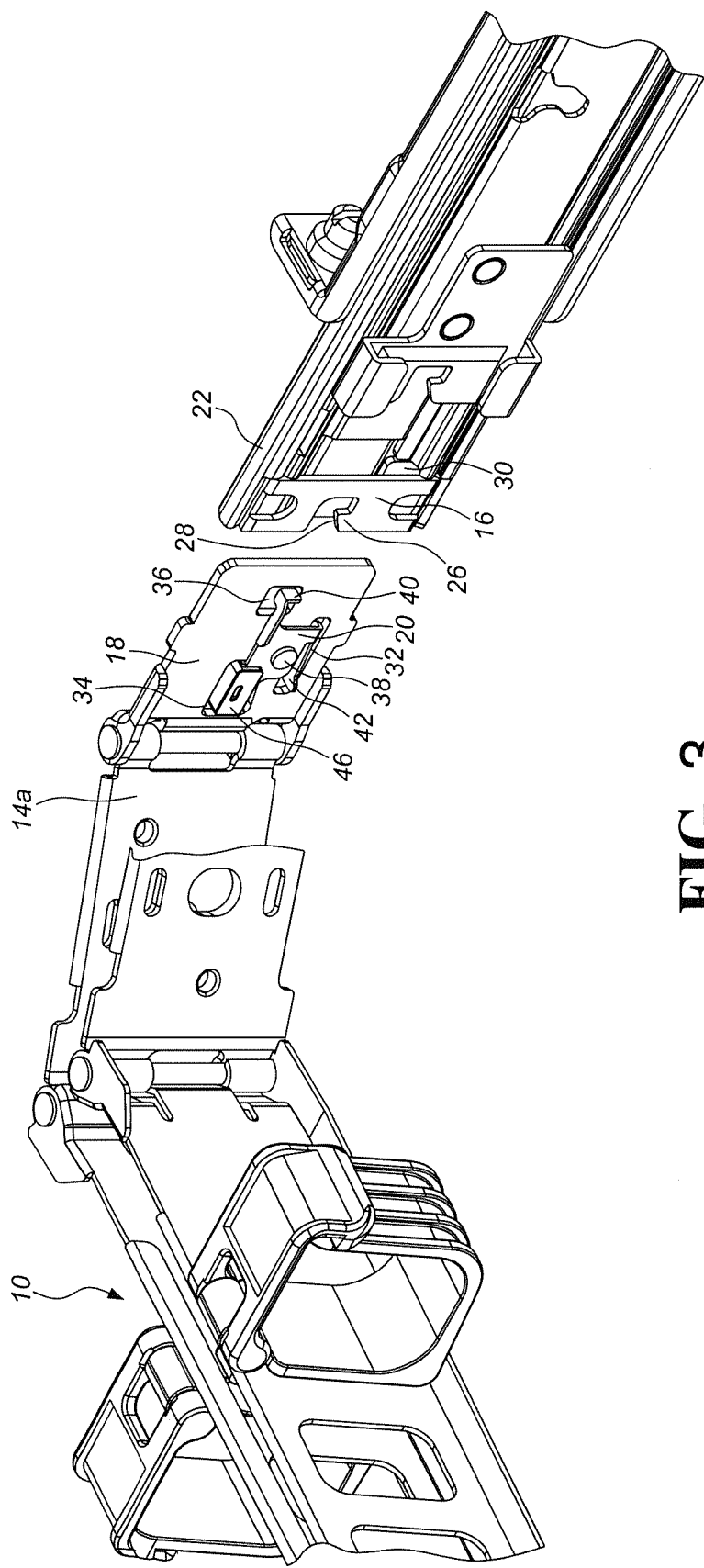
FIG. 3 shows the connection member of the present invention is to be connected with the fixing frame.

Referring to FIGS. 1 and 2, the cable management arm 10 has multiple cable baskets 12 for organizing cables (not shown) and the cable management arm 10 has a first end 14a and a second end 14b, wherein each of the first and second ends 14a, 14b has a connection device of the present invention. The connection device connected to the first end 14a of the cable management arm 10 comprises a fixing frame 16, a connection member 18 and a locking member 20, wherein the fixing frame 16 is connected to a rack or a rail. In this embodiment, the fixing frame 16 is connected to a first rail 22, or the fixing frame 16 is combined with the first rail 22. As shown in FIGS. 2 and 3, the fixing frame 16 has a slot 24 and a protrusion portion 26 which is located within the slot 24. The protrusion portion 26 has an inclined surface 28. Preferably, the protrusion portion 26 is a hook-shaped protrusion. The fixing frame 16 has a pair of bent portions 30 which define a passage 31 so that the connection member 18 is inserted and installed in the passage 31 of the fixing frame 16. In this embodiment, the bent portions 30 are fixed to the first rail 22 and each bent portion 30 has a pillar 33. The first rail 22 has two corresponding ports such as holes to receive the two pillars 33.

The connection member 18 is pivotably connected to the first end 14a of the cable management arm 10 and has a contact portion 32, an operation window 34 and an engaging window 36. The contact portion 32 is preferably located beneath the operation window 34 and the engaging window 36. Preferably, the contact portion 32 is a window and the contact portion 32 contacts an inside of the window. The connection member 18 has a pair of stops 37 which are located corresponding to the bent portions 30 of the fixing frame 16.

The locking member 20 is pivotably connected to the connection member 18 by a pivotal member 38 and has a locking portion 40, a resilient portion 42 and a driving portion 44. The locking portion 40 is located within the engaging window 36 of the connection member 18 and the resilient portion 42 contacts the contact portion 32 of the connection member 18. The driving portion 44 is located corresponding to the operation window 34 of the connection member 18. In a preferable embodiment, a cap 46 is connected to the driving portion 44 of the locking member 20 and a portion of the cap 46 is exposed via the operation window 34. The two sides of the connection member 18 are easily operated by the cap 46 such as pressing the driving portion 44 of the locking member 20.

Figure 4:
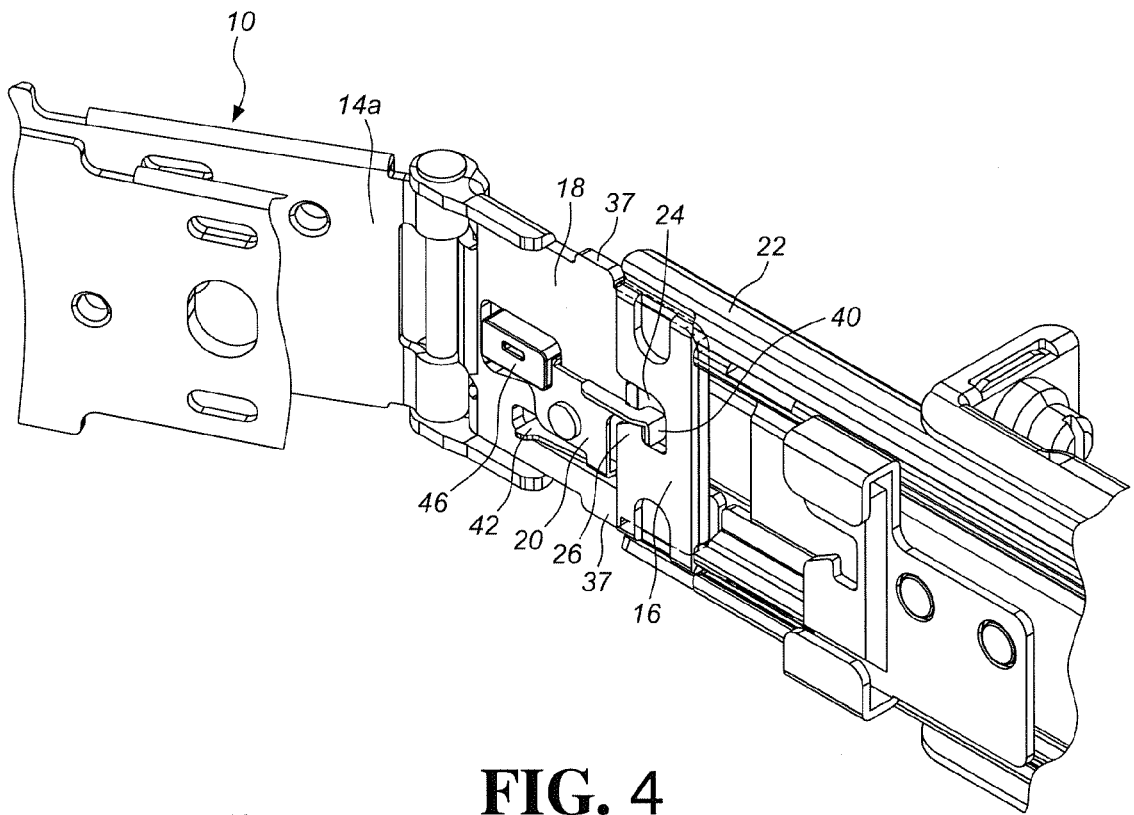
FIG. 4 shows the connection member of the present invention is connected with the fixing frame.

When the first end 14a of the cable management arm 10 is connected to the first rail 22 by the connection member 18 as shown in FIG. 4, the locking portion 40 of the locking member 20 is inserted into the slot 24 of the fixing frame 16. The resilient portion 42 provides a force to lock the locking portion 40 to the protrusion portion 26 of the fixing frame 16 by response to the force of the resilient portion 42, such that the connection member 18 is positioned to the fixing frame 16.

That is to say, the first end 14a of the cable management arm 10 is connected to the first rail 22. Besides, when the connection member 18 is inserted into the fixing frame 16, the stops 37 of the connection member 18 move a pre-set distance relative to the fixing frame 16 and the stops 37 contact the bent portions 30 of the fixing frame 16.

Furthermore, the locking portion 40 of the locking member 20 is an extended plate which is a vertical plate, and the inclined surface 28 of the protrusion portion 26 of the fixing frame 16 guides the locking portion 40 to engage with the protrusion portion 26. By this way, the connection member 18 is automatically positioned when inserted into the fixing frame 16.

Figure 5:
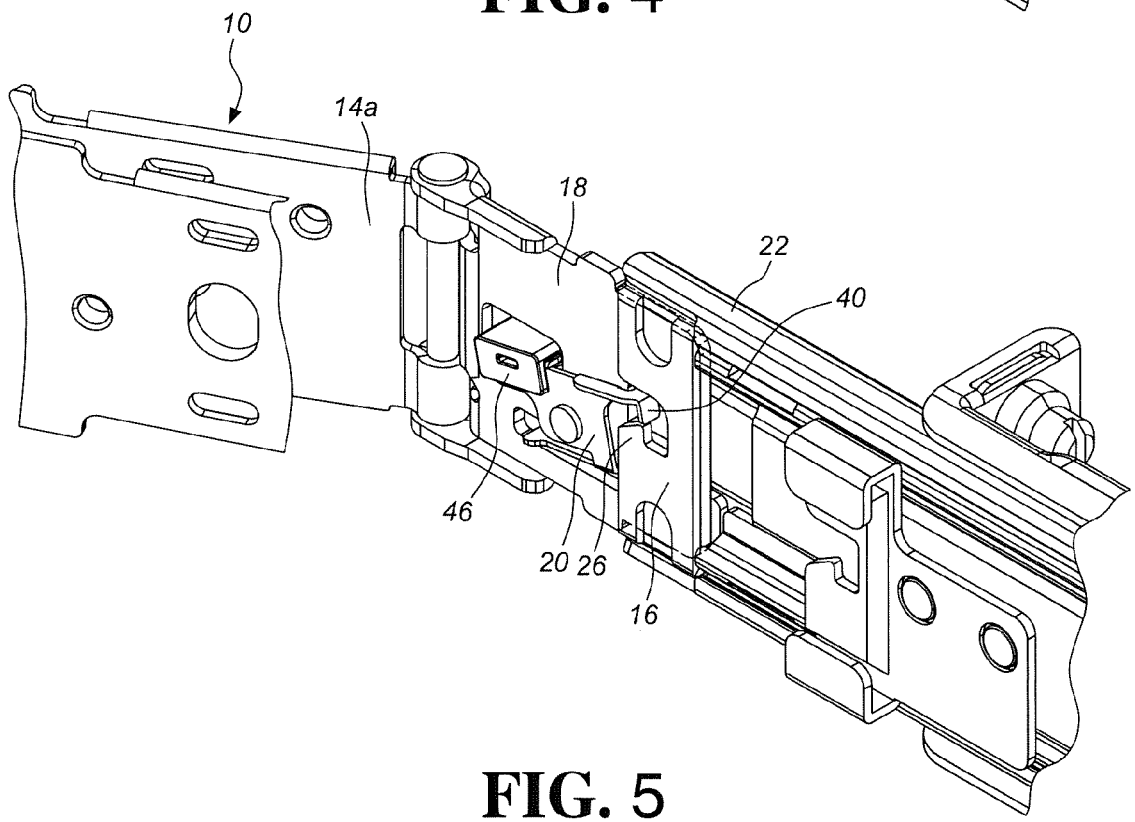
FIG. 5 shows the connection member of the present invention is disengaged from the fixing frame.

FIG. 5 shows that when the first end 14a of the cable management arm 10 is to be removed from the first rail 22, the fixing frame 16 and the connection member 18 are released by operating the cap 46 of the locking member 20, such as pressing the cap 46, to swing the locking member 20 so that the locking portion 40 is disengaged from the protrusion portion 26 of the fixing frame 16.

The fixing frame 16, the connection member 18, the locking member 20 and the cap 46 of the connection device connected to the first end 14a of the cable management arm 10 can be named with an annex of "first" so as to be distinguished from the connection device connected to the second end 14b of the cable management arm 10.

Figure 6:
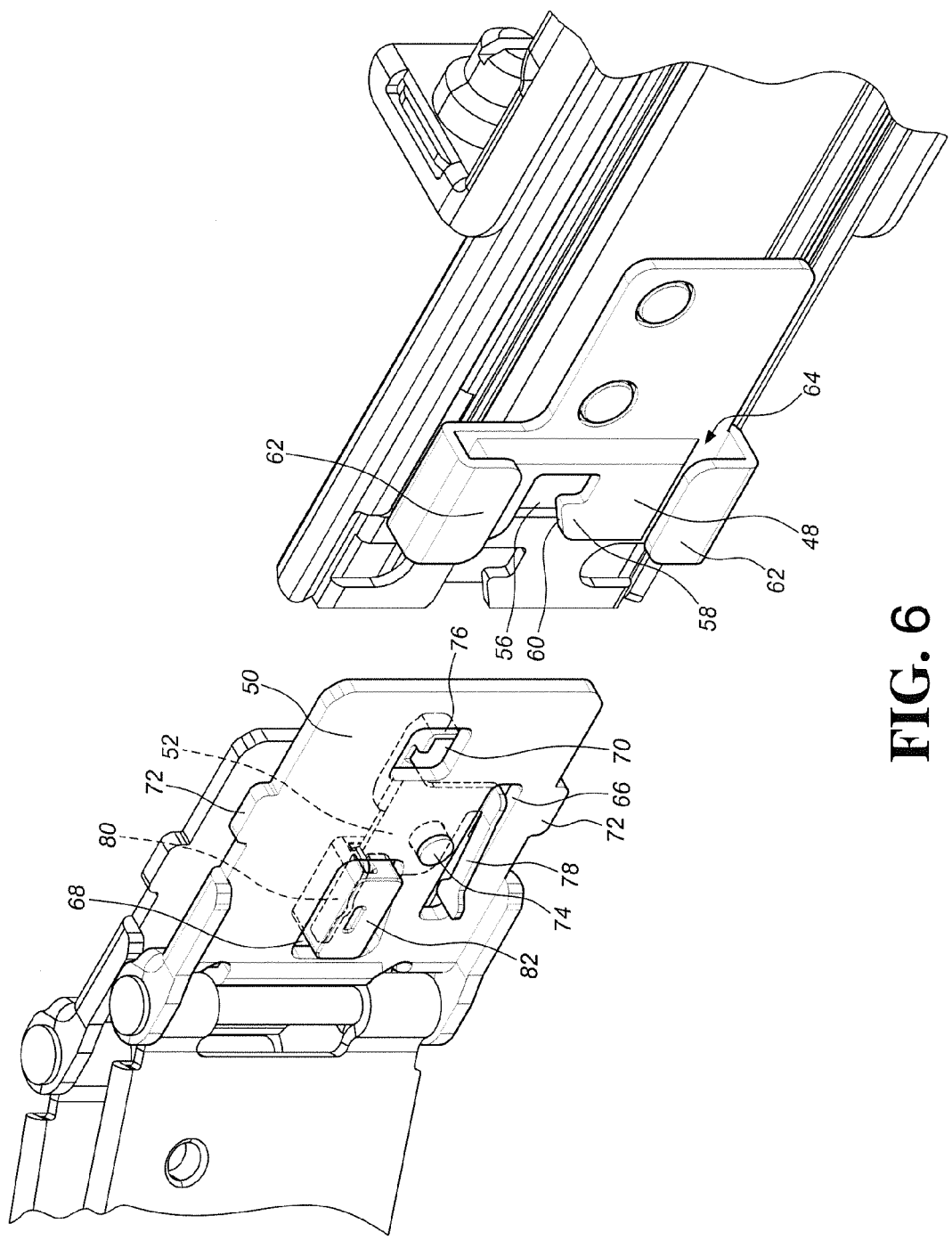
FIG. 6 shows the second connection member of the present invention is to be connected with the second fixing frame.

As shown in FIG. 1, the connection device connected to the second end 14b of the cable management arm 10 comprises a second fixing frame 48, a second connection member 50 and a second locking member 52, wherein the second fixing frame 48 is fixed to a second rail 54 which is slidable relative to the first rail 22. The second connection member 50 is pivotably connected to the second end 14b of the cable management arm 10. As shown in FIG. 6, the second fixing frame 48 is similar to the fixing frame 16 and comprises a slot 56, a protrusion portion 58, an inclined surface 60 and a pair of second bent portions 62. The second bent portions 62 define a passage 64 so that the second connection member 50 is inserted into the passage 64 of the second fixing frame 48 to be installed. The second connection member 50 is similar to the connection member 18 and comprises a contact portion 66, an operation window 68, an engaging window 70 and a pair of stops 72. The second locking member 52 is pivotably connected to the second connection member 50 by another pivotal member 74 and is similar to the locking member 20. The second locking member 52 comprises a locking portion 76, a resilient portion 78 and a driving portion 80. A second cap 82 is fixed to the driving portion 80 of the second locking member 52 and is similar to the cap 46.

Figure 7:
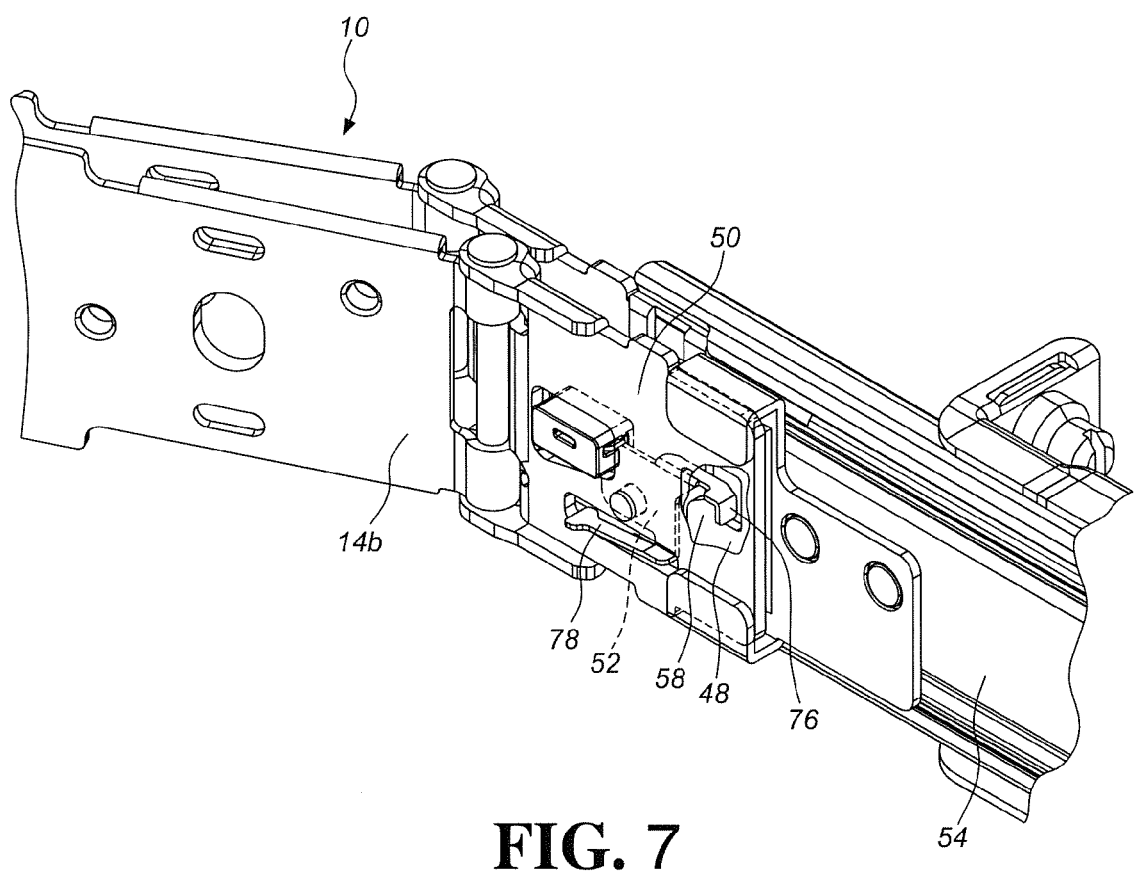
FIG. 7 shows the second connection member of the present invention is connected with the second fixing frame.

As shown in FIG. 7, when the second connection member 50 is connected to the second fixing frame 48, the resilient portion 78 of the second locking member 52 provides a force to lock the locking portion 76 of the second locking member 52 to the protrusion portion 58 of the second fixing frame 48. The second end 14b of the cable management arm 10 is connected to the second rail 54 by the second connection member 50.

The way that the second end 14b of the cable management arm 10 is to be disengaged from the second rail 54 is similar to the way that the first end 14a of the cable management arm 10 is disengaged from the first rail 22, and will not be described in detail.

The present invention allows the users to operate the cap 46 and/or second cap 82 from two sides of the connection member 18 and the second connection member 50. The cable management arm of the present invention can be installed to the rails on left side or right side of the rack. Especially, there is no protruding plunger to compress the available room of the chassis in the rack.

While we have shown and described the embodiment in accordance with the present invention, it should be clear to those skilled in the art that further embodiments may be made without departing from the scope of the present invention.

What is claimed is:

1. A connection device of a cable management arm, comprising:
    a fixing frame having a protrusion portion, the fixing frame having a pair of bent portions which define a passage;
    a connection member pivotably connected to the cable management arm and having a contact portion, the connection member being inserted into the passage of the fixing frame, the connection member having a pair of stops which are located corresponding to the bent portions of the fixing frame, when the connection member is inserted into the passage of the fixing frame, the stops contact the bent portions, and
    a locking member pivotably connected to the connection member and having a locking portion and a resilient portion, the resilient portion contacting the contact portion of the connection member, the resilient portion providing a force to lock the locking portion to the protrusion portion of the fixing frame so as to securely connect the connection member to the fixing frame.

2. The device as claimed in claim 1, wherein the connection member has an operation window and the locking member has a driving portion which is located corresponding to the operation window.

3. The device as claimed in claim 2, further comprising a cap connected to the driving portion of the locking member, the cap having a portion thereof exposed via the operation window.

4. The device as claimed in claim 1, wherein the connection member has an engaging window and the locking portion of the locking member is located in the engaging window.

5. The device as claimed in claim 1, wherein the contact portion of the connection member is a window through which the resilient portion extends and contacts an inside of the window.

6. A connection device of a cable management arm, comprising:
    a fixing frame having a protrusion portion;
    a connection member pivotably connected to the cable management arm and having a contact portion, the connection member having an operation window,
    a locking member pivotably connected to the connection member and having a locking portion, a driving portion and a resilient portion, the resilient portion contacting the contact portion of the connection member, the resilient portion providing a force to lock the locking portion to the protrusion portion of the fixing frame so as to securely connect the connection member to the fixing frame, and the driving portion being located corresponding to the operation window, and
    a cap connected to the driving portion of the locking member, the cap having a portion thereof exposed via the operation window.

7. The device as claimed in claim 6, wherein the fixing frame has a pair of bent portions which define a passage, the connection member is inserted into the passage of the fixing frame.

8. The device as claimed in claim 7, wherein the connection member has a pair of stops which are located corresponding to the bent portions of the fixing frame, when the connection member is inserted into the passage of the fixing frame, the stops contact the bent portions.

9. The device as claimed in claim 6, wherein the connection member has an engaging window and the locking portion of the locking member is located in the engaging window.

10. The device as claimed in claim 6, wherein the contact portion of the connection member is a window through which the resilient portion extends and contacts an inside of the window.

11. A connection device of a cable management arm, comprising:
    a fixing frame having a protrusion portion;
    a connection member pivotably connected to the cable management arm and having a contact portion, and
    a locking member pivotably connected to the connection member and having a locking portion and a resilient portion, the resilient portion contacting the contact portion of the connection member, the resilient portion providing a force to lock the locking portion to the protrusion portion of the fixing frame so as to securely connect the connection member to the fixing frame,
    wherein the contact portion of the connection member is a window through which the resilient portion extends and contacts an inside of the window.

12. The device as claimed in claim 11, wherein the fixing frame has a pair of bent portions which define a passage, the connection member is inserted into the passage of the fixing frame.

13. The device as claimed in claim 12, wherein the connection member has a pair of stops which are located corresponding to the bent portions of the fixing frame, when the connection member is inserted into the passage of the fixing frame, the stops contact the bent portions.

14. The device as claimed in claim 11, wherein the connection member has an operation window and the locking member has a driving portion which is located corresponding to the operation window.

15. The device as claimed in claim 14, further comprising a cap connected to the driving portion of the locking member, the cap having a portion thereof exposed via the operation window.

16. The device as claimed in claim 11, wherein the connection member has an engaging window and the locking portion of the locking member is located in the engaging window.

* * * * *